United States Patent
Kawaguchi

(10) Patent No.: US 6,890,970 B2
(45) Date of Patent: May 10, 2005

(54) THERMAL CONDUCTIVE MATERIAL AND METHOD FOR PRODUCING THE SAME

(75) Inventor: Yasuhiro Kawaguchi, Nagoya (JP)

(73) Assignee: Kitagawa Industries Co., Ltd., Nagoya (JP)

( * ) Notice: Subject to any disclaimer, the term of this patent is extended or adjusted under 35 U.S.C. 154(b) by 43 days.

(21) Appl. No.: 09/872,713

(22) Filed: Jun. 1, 2001

(65) Prior Publication Data

US 2002/0033561 A1 Mar. 21, 2002

(30) Foreign Application Priority Data

Jun. 2, 2000 (JP) ........................................ 2000-166173

(51) Int. Cl.[7] .............................. G21F 1/10; C08K 3/04; C08K 3/10
(52) U.S. Cl. ........................ 523/137; 524/404; 524/437; 524/440; 524/495
(58) Field of Search .......................... 523/137; 524/404, 524/437, 440, 495

(56) References Cited

U.S. PATENT DOCUMENTS

| | | | | |
|---|---|---|---|---|
| 4,508,640 A | * | 4/1985 | Kanda et al. | |
| 5,177,143 A | * | 1/1993 | Chang et al. | |
| 5,569,516 A | * | 10/1996 | Paeglis et al. | ................. 428/58 |
| 5,849,824 A | * | 12/1998 | Mercer et al. | |
| 5,929,138 A | * | 7/1999 | Mercer et al. | |
| 6,391,442 B1 | * | 5/2002 | Duvall et al. | |
| 6,451,422 B1 | * | 9/2002 | Nguyen | |

FOREIGN PATENT DOCUMENTS

| | | |
|---|---|---|
| JP | 02-075643 | 3/1990 |
| JP | 2000-151160 | 5/2000 |
| WO | 97/41599 | 11/1997 |

* cited by examiner

Primary Examiner—Tae H. Yoon
(74) Attorney, Agent, or Firm—Davis & Bujold, P.L.L.C.

(57) ABSTRACT

A thermal conductive material is obtained by kneading an organic material, having the melting transition in the range of 30–70° C. and the viscosity at 100° C. equal to or above 70,000 cP, and a filler at the ratio of 100:40–900. It has a property of flexibly changing its form by being plasticized due to liquidation of the composing organic material upon receipt of heat from an electronic component. Accordingly, adhesion of the thermal conductive material toward the electronic component and a heat sink is increased and thermal conductivity is improved. Additionally, since the thermal conductive material changes its form according to the outer shape of the electronic component, load is evenly applied to the whole electronic component and does not concentrate on part of the electronic component.

5 Claims, 2 Drawing Sheets

THERMAL CONDUCTIVE MATERIAL AND METHOD FOR PRODUCING THE SAME

FIELD OF THE INVENTION

Figure 1:
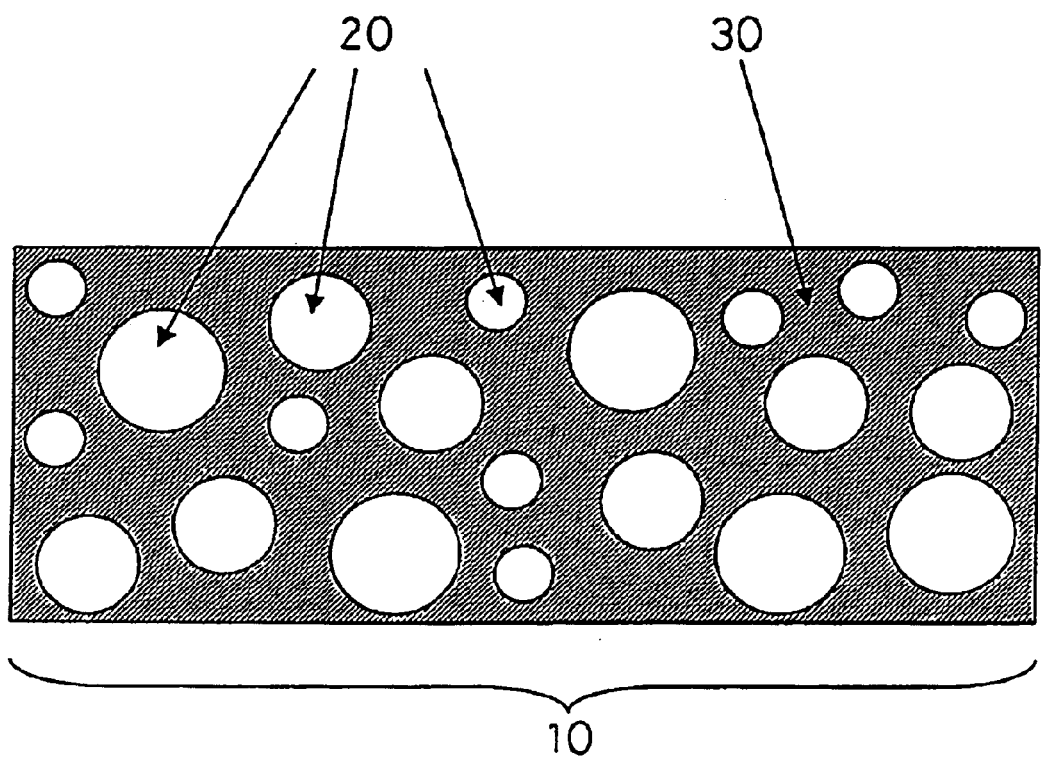

This invention relates to a thermal conductive material, and a method for producing the same, to be placed against a heating element such as an electronic component to help dissipate the heat from the heating element.

BACKGROUND OF THE INVENTION

Inside an electric/electronic apparatus, for example, a thermal conductive material has been arranged between a heat-generating electronic component and a heat sink such as a heat dissipation plate or a metal case panel to efficiently radiate the heat produced from the electronic component and to prevent the electronic component from overheating.

Particularly in recent years, an increase of calorific value caused by accelerated CPUs has necessitated thermal conductive materials having high thermal conductivity. Such thermal conductive materials have been produced by dispersing a filler such as ceramics within a base material such as rubber, resin and the like. The examples of such thermal conductive materials are those made by kneading vulcanized EPDM (ethylene-propylene-diene terpolymer) resin and ceramic powder or by kneading paraffin and ceramic powder.

However, conventional ever-solid thermal conductive materials (such as those made by kneading vulcanized EPDM and ceramic powder) cannot change their forms corresponding to the outer shape of the electronic component and the heat sink. Because of this lack of flexibility, there remain air gaps at the contact surface between the thermal conductive material and the electronic component, or between the thermal conductive material and the heat sink, thus reducing thermal conductive effect.

SUMMARY OF THE INVENTION

Objects of the present invention are to provide a phase transition type thermal conductive material, presenting favorable thermal resistance and thermal conductivity, and to provide a production method thereof.

In one aspect of the present invention, the thermal conductive material is plasticized (softened) at the temperature ranging from 30–65° C., at which temperature the material is generally in use, and changes its form flexibly corresponding to the surface form of which it comes in contact with.

When the thermal conductive material is used at room temperature, for example, it is in a rubber-like state having appropriate solidity. Because it does not stick to hands, easy handling such as placing it to an electronic component is possible.

Nevertheless, when the temperature of the thermal conductive material goes up to 30–65° C. along with the elevation of the temperature of the electronic component, the thermal conductive material plasticizes itself, changing its form corresponding to the outer shape of the electric component and thus adhering to the surface of the electronic component. Since the thermal conductive material has high thermal conductivity, it can efficiently dissipate heat from the electronic component and prevents the electronic component from overheating.

When the temperature of the thermal conductive material goes down to room temperature as the electronic component is cooled down, the thermal conductive material hardens itself until it comes into the rubber-like state, and removal of the thermal conductive material from the electronic component can be easy.

Throughout the description of the present invention, "to be plasticized" implies "to be softened by heat" (so as to change the form corresponding to the outer shape of which it comes in contact with).

In another aspect of the present invention, the thermal conductive material is plasticized at 60° C. with the application of pressure equal to or above 6.0 g/cm$^2$ and changes its form flexibly corresponding to the surface form of which it comes in contact with. Accordingly, the same effects (improvement in workability and heat radiation) as above can be achieved.

In another aspect of the present invention, the thermal conductive material comprises an organic material of which melting transition is in the range of 30–70° C. Therefore, when heat is applied from the electronic component and the temperature of the organic material reaches the melting transition, for example, the organic material gets liquidized. At this time, a filler having high thermal conductivity is evenly dispersed within the liquidized organic material. The thermal conductive material of the present invention then changes its form (platicizes itself) corresponding to the outer shape of which it comes in contact with and maintains the form thereafter.

Owing to the property of being plasticized by heat, the thermal conductive material of the present invention exhibits the following excellent effects.

i) As the thermal conductive material improves adhesion to the electronic component and the heat sink, close contact is secured between the thermal conductive material and the electronic component and between the thermal conductive material and the heat sink, thus enhancing the thermal conductive effect.

ii) Load on the electronic component from the thermal conductive material is applied to the whole electronic component evenly and not only to part of the electronic component.

In addition to having the melting transition in the range of 30–70° C., the organic material of the thermal conductive material has the viscosity at 100° C. equal to or above 70,000 cP, and also the ratio of the filler to the whole thermal conductive material is in the range of 30–90 weight %.

Due to this high viscosity at 100° C., even when the thermal conductive material is bound between the electronic component such as a CPU and the heat sink, there is no fear of running down (liquid dripping). The thermal conductive material of the present invention is ideal without liquid dripping at least at the temperature equal to or under 100° C.

The term "room temperature" used herein, for example, is considered to be in the range of 20–25° C. (23° C. may be appropriate definition of the room temperature.)

In another aspect of the present invention, the thermal conductive material is in the rubber-like state at room temperature. Therefore, it is easy to handle and can be placed with ease to the electronic component at room temperature.

In another aspect of the present invention, the organic material of the thermal conductive material is olefin resin. The examples of the olefin resin are unvulcanized EPDM, PE (polyethylene), EVA (ethylene vinyl acetate copolymer) and EEA (ethylene-ethyl alcohol). In addition to the olefin resin, paraffin can be also used.

In another aspect of the present invention, the organic material of the thermal conductive material is unvulcanized EPDM having 7,000–50,000 molecular weight. Such unvulcanized EPDM is superior in lubricity and thus, even if the ratio of the filler to the organic material is high, kneading can be successfully performed. Consequently, the thermal conductive material can contain high ratio of the filler to the organic material.

In another aspect of the present invention, the filler in the thermal conductive material is of at least one of ceramics, metallic powder, metallic magnetic body or carbon fiber. The examples of the filler of ceramics are silicon carbide, boron nitride, alumina, aluminum hydroxide, zinc oxide, magnesia, magnesium hydroxide, silicon nitride and aluminum nitride. Because these ceramics have high thermal conductivity, the thermal conductive material of the present invention can produce excellent thermal conductive effect.

Other than the above-mentioned ceramics, soft ferrite can also be used as the filler. Ni—Zn-based ferrite and Mn—Zn ferrite are the examples of the soft ferrite. Because these soft ferrites have high magnetic shielding effect, the thermal conductive material of the present invention can achieve high magnetic shielding effect.

Gold, silver, copper and aluminum are the examples of metallic powders. Because the metallic powders have high thermal conductivity and are superior in electric field shielding, the thermal conductive material of the present invention can create both excellent thermal conductive and electric field shielding effect.

Silicon steel (Fe—Si), permalloy (Fe—Ni), sendust (Fe—Al—Si), permendur (Fe—Co) and SuS (Fe—Cr) are the examples of metallic magnetic bodies. Because these metallic magnetic bodies are superior in magnetic shielding, the thermal conductive material of the present invention can achieve high magnetic shielding.

PAN (poly-acrylonitrile), pitch, vapor-grown carbon fiber, curled carbon fiber or graphite can be used as the filler. Because these carbon fibers have high thermal conductivity and are superior in electric field shielding, the thermal conductive material can create both excellent thermal conductive and electric field shielding effect.

In another aspect of the present invention, the thermal conductive material comprises the filler having electromagnetic shielding effect. Therefore, the thermal conductive material of the present invention can produce electromagnetic shielding effect.

Electromagnetic shielding effect implies either electric field shielding effect, magnetic shielding effect or both of them.

With the use of the thermal conductive material with the electronic component, measures against electromagnetic waves as well as the heat from the electronic component can be taken.

In another aspect, the present invention provides a method for producing the thermal conductive material as above. Therefore, the thermal conductive material of the present invention has the same structure, behavior and effect as described above.

BRIEF DESCRIPTION OF THE DRAWING FIGURES

Figure 2:
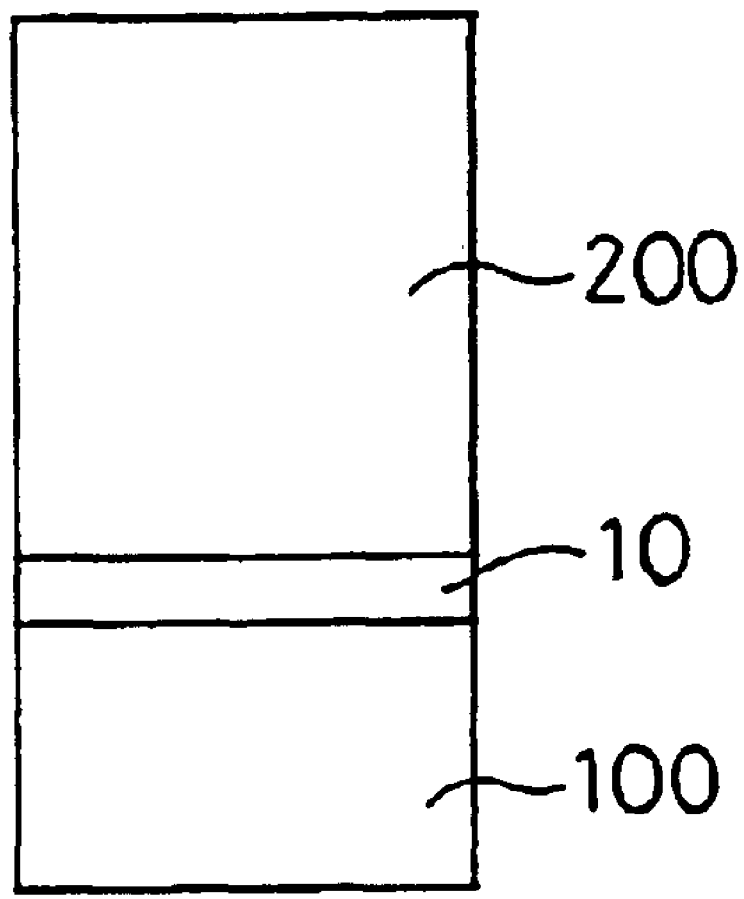

The invention will now be described, by way of example, with reference to the accompanying drawings, in which:

FIG. 1 is an explanatory view illustrating a schematic structure of a thermal conductive material according to an embodiment of the invention; and FIG. 2 is an explanatory view illustrating a manner of experiment according to the third example.

DETAILED DESCRIPTION OF THE INVENTION

The thermal conductive material of the present embodiment was produced by kneading 40–900 weight parts of filler and 100 weight parts of organic material. By mixing said filler and organic material, the filler is dispersed in the organic material. A two-roll machine, a kneader, a Banbury mixer and the like can be used for the mixing.

A material having the melting transition in the range of 30–70° C. and the viscosity at 100° C. equal to or above 70,000 cp is used for the organic material. Specifically, olefin resin, such as unvulcanized EPDM, ethylene-vinyl acetate copolymer, polyethylene, polyisobutylene and ethylene-ethyl alcohol, which satisfies the above conditions of the melting transition and the viscosity can be used. In particular, an organic material flexible at room temperature is preferred. For example, an unvulcanized EPDM having 7,000–50,000 molecular weight can satisfy the above conditions.

As previously discussed, ceramics, metallic powder, metallic magnetic body or carbon fiber can be used as the filler. In this case, not only either one of the above fillers can be solely used, but also mixture of some or all of them can be used. The filler can be in the form of powder, flake, fiber or the like.

As shown in FIG. 1, the thermal conductive material 10 produced in the above manner has a structure, which contains the filler 20 dispersed in the organic material 30.

When the thermal conductive material 10 receives heat form an electronic component and it temperature rises to the melting transition the organic material 30 contained in the thermal conductive material 10, the organic material 30 is liquidized. The thermal conductive material 10 at this state is plasticized and is flexible enough to change its form.

Owing to the property of plasticizing itself by receiving heat, the thermal conductive material 10 according to the present embodiment changes its form corresponding to the outer shape of the electronic component and the heat sink when heat is applied, thus improving its adhesion. As the result, the contact area between the thermal conductive material 10 and the electronic components and between the thermal conductive material 10 and the heat sink becomes large, and high thermal conductivity can be achieved.

Since the thermal conductive material 10 changes its form corresponding to the outer shape of the electronic component, load is evenly applied to the whole electronic component and does not concentrate on part of the electronic component.

Additionally, in case the organic material which is flexible even at room temperature (for example, unvulcanized EPDM) is used, the above effect is obtained also at room temperature.

In case the thermal conductive material is bound between the electronic component and the heat sink, it does not run down at the temperature equal to or under 100° C. Accordingly, it can be properly used at least when the temperature is equal to or under 100° C. Because the thermal conductive material is generally used at the temperature between 0–100° C., it can be said that it has sufficient thermal resistance. When soft ferrite (such as Ni—Zn-based ferrite and Mn—Zn ferrite) or metallic magnetic body (such as silicon steel (Fe—Si), permalloy (Fe—Ni), sendust (Fe—Al—Si), permendur (Fe—Co), SuS (Fe—Cr)) is used as the filler, the thermal conductive material according to the present embodiment serves as a magnetic shield.

When metallic powder (such as gold, silver, copper and aluminum) or carbon fiber (such as PAN, pitch, vapor grown carbon fiber, curl-based carbon fiber and graphite) is used as the filler, the thermal conductive material according to the present embodiment serves as an electric field shield.

Experiments

The present invention will be now specifically described with reference to examples.

Examples 1–2 are experiments according to the present invention, and Comparative Examples 1–2 are experiments out of the scope of the present invention.

EXAMPLE 1

100 weight parts of unvulcanized EPDM and 230 weight parts of filler (SiC) were kneaded and formed into a sheet.

EXAMPLE 2

100 weight parts of unvulcanized EPDM and 120 weight parts of filler (BN) were kneaded and molded into a sheet.

Comparative Example 1

Unvulcanized EPDM was solely molded into a sheet.

Comparative Example 2

100 weight parts of paraffin (having 1,000 molecular weight) and 150 weight parts of filler ($Al_2O_3$) were kneaded and molded into a sheet.

Properties of the thermal conductive sheets in the Examples 1–2 and Comparative Examples 1–2 were examined. The result is shown in Table 1. The properties of each material and the ratio of the filler are also shown.

TABLE 1

| | Melting transition of organic material (° C.) | Flexibility of organic material at room temperature | Viscosity of organic material at 100° C. (cP) | Ratio of filler (wt %) | Liquid dripping at 100° C. | Thermal conductivity (W/K · m) |
|---|---|---|---|---|---|---|
| Ex. 1 | 45 | High | 70,000 | 70 | No | 2.5 |
| Ex. 2 | 45 | High | 70,000 | 55 | No | 2.3 |
| Comp. Ex. 1 | 45 | High | 70,000 | 0 | Yes | — |
| Comp. Ex. 2 | 40 | Low | 500 | 60 | Yes | 1.0 |

The liquid dripping in Table 1 is a phenomenon in which a thermal conductive material is fluidized and runs down when bound between the electronic component and the heat sink. The viscosity was measured by a B-type viscometer. The thermal conductivity was measured by a QTM-500, a product of Kyoto Electronics Manufacturing Co., Ltd.

As shown in Table 1, the thermal conductive sheets of Example 1–2 have high thermal conductivity. Accordingly, they are superior in heat radiation. In addition, the organic materials in both thermal conductive sheets are liquidized at 100° C. but liquid dripping does not occur. Thus, they are superior also in thermal resistance.

The resin in Comparative Example 1 shows liquid dripping at 100° C., which indicates that liquid dripping occurs when the ratio of the filler is low.

The thermal conductive sheet in Comparative Example 2 has low thermal conductivity and liquid dripping occurs at 100° C. It is inferior in heat radiation and thermal resistance.

EXAMPLE 3

An additional experiment for determining conditions for softening of the thermal conductive material of Example 1 was performed.

As shown in FIG. 2, the thermal conductive material 10 was placed on a heater 100 and a block 200 (block 1, 2 or 3) was positioned on it. The heater 100 was turned on and the temperature of the thermal conductive material 10 was set to be 60° C.

A 3 cm×3 cm×5 cm block having specific gravity of 1 was used as the block 1. The weight of the block 1 is 45 g, and the area of base is 9 $cm^2$. The pressure applied to the thermal conductive material is equal to 5 $g/cm^2$ (45 g divided by 9 $cm^2$).

A 3 cm×3 cm×6 cm block having specific gravity of 1 was used as the block 2. The weight of the block 2 is 54 g, and the area of base is 9 $cm^2$. The pressure applied to the thermal conductive material is equal to 6 $g/cm^2$ (54 g divided by 9 $cm^2$).

A 3 cm×3 cm×6 cm block having specific gravity of 9 was used as the block 3. The weight of the block 3 is 486 g, and the area of base is 9 $cm^2$. The pressure applied to the thermal conductive material is equal to 54 $g/cm^2$ (486 g divided by 9 $cm^2$).

The result of this experiment shows that the thermal conductive material does not change its form when the applied pressure is 5 $g/cm^2$, but is plasticized and changes its form corresponding to the surface form of a member with which it comes in contact, when the temperature of the thermal conductive material is at 60° C. and the pressure applied is equal to 6 g/cm² and 54 g/cm², that is, when the pressure is equal to or above 6 g/cm².

When the thermal conductive material of Example 2 was used in the same manner, the same result as described above was obtained.

The present invention is not limited to the above embodiments, and other modifications and variations are possible within the scope of the present invention. For instance, other organic materials and fillers can be substituted. The means for kneading and molding provided according to the present invention are not necessarily limited to those described in the examples.

What is claimed is:

1. A thermal conductive material comprising:

an unvulcanized ethylene-propylene-diene terpolymer organic material; and a filler having a higher thermal conductivity than the unvulcanized ethylene-propylene-diene terpolymer organic material, wherein the thermal conductive material is plasticized at a temperature in the range of 30–65° C. and the thermal conductive material changes form to flexibly correspond to a form of a surface of a member with which the thermal conductive material comes in contact; and the unvulcanized ethylene-propylene-diene terpolymer organic material has a melting transition in the range of 30–70° C. and a viscosity at 100° C. is equal to or above 70,000 cP, a weight ratio of the filler to the thermal conductive material is in the range of 30–90 weight %.

2. The thermal conductive material according to claim 1, wherein the thermal conductive material is plasticized at 60° C. under a pressure equal to or above 6.0 g/cm².

3. The thermal conductive material according to claim 1, wherein the thermal conductive material is in an elastomeric state at room temperature.

4. The thermal conductive material according to claim 1, wherein the filler is at least one of ceramics, metallic powder, metallic magnetic body and carbon fiber.

5. The thermal conductive material according to claim 1, wherein the filler is a material serving as an electromagnetic shield.

* * * * *